United States Patent [19]

Busman et al.

[11] Patent Number: 4,511,641
[45] Date of Patent: Apr. 16, 1985

[54] METAL FILM IMAGING STRUCTURE

[75] Inventors: Stanley C. Busman, Oakdale; John C. Chang, New Brighton, both of Minn.

[73] Assignee: Minnesota Mining and Manufacturing Company, St. Paul, Minn.

[21] Appl. No.: 463,295

[22] Filed: Feb. 2, 1983

[51] Int. Cl.³ .................. G03C 1/60; G03C 1/90; G03F 7/26

[52] U.S. Cl. .................. 430/158; 430/142; 430/143; 430/161; 430/162; 430/166; 430/252; 430/253; 430/254; 430/257; 430/258; 430/259; 430/271; 430/273

[58] Field of Search .............. 430/253, 254, 160, 161, 430/158, 166, 271, 142, 143, 273, 162, 257, 260, 258, 259, 252

[56] References Cited

U.S. PATENT DOCUMENTS

| | | | |
|---|---|---|---|
| 3,060,023 | 10/1962 | Burg et al. | 96/28 |
| 3,445,229 | 5/1969 | Webers | 96/28 |
| 3,469,982 | 9/1969 | Celeste | 96/35.1 |
| 3,997,349 | 12/1976 | Sanders | 430/163 |
| 4,123,578 | 10/1978 | Perrington et al. | 428/206 |
| 4,205,989 | 6/1980 | Moriya et al. | 430/253 |
| 4,210,711 | 7/1980 | Kitajima et al. | 430/253 |
| 4,247,619 | 1/1981 | Cohen et al. | 430/253 |
| 4,271,256 | 6/1981 | Kido et al. | 430/253 |
| 4,284,703 | 8/1981 | Inoue et al. | 430/142 |
| 4,291,114 | 9/1981 | Berggren et al. | 430/253 |
| 4,369,244 | 1/1983 | Eian et al. | 430/303 |

FOREIGN PATENT DOCUMENTS

2020837  11/1979  United Kingdom ............... 430/157

Primary Examiner—Charles L. Bowers, Jr.
Attorney, Agent, or Firm—Donald M. Sell; James A. Smith; Mark A. Litman

[57] ABSTRACT

An image-forming laminate is formed by the combination of a thin, frangible light opaque material on top of a photosensitive layer which changes its surfactant properties when irradiated. The photosensitive layer according to the present invention comprises a film-forming polymeric binder, a photosensitive acid generator, and a surfactant selected from nonionic surfactants, the neutral form of cationic surfactants, amphoteric surfactants, and surfactant acid salts. Preferably the frangible light opaque material is a thin metal layer. There can also be present a support layer on the other surface of the photosensitive layer, as well as there can be an adhesive layer secured to the upper surface of the frangible light opaque material. The strength of adherence of the adhesive layer to the metal should be intermediate the strength of the adherence of the light opaque material prior to and after photoactivation.

20 Claims, 2 Drawing Figures

METAL FILM IMAGING STRUCTURE

FIELD OF THE INVENTION

The present invention relates to photosensitive imaging materials, and particularly photosensitive imaging materials which rely upon a change in surface activity of a polymer, the change being effected by actinic radiation. Such imaging materials would be generally useful in the graphic arts field, and would have particular utility in projection transparencies, displays, electrodes for electroluminescent displays, printed circuits, labels, high resolution information recording films, and intermediate or secondary originals for the preparation of multiple image copies.

DESCRIPTION OF THE PRIOR ART

Both negative- and positive-acting photoresist methods and materials are well known in the art. Such methods use the wet development of a photosensitive material which alters its solubility in a given developer when light struck. Various compositions, structures and methods are shown in U.S. Pat. Nos. 4,318,975; 4,247,616; 4,193,797; 4,169,732 and 3,469,982. These light sensitive compositions are represented by photocurable polymers, photodecomposable polymers and photosolubilizable binders. Thin layer images can be obtained by first exposing the photosensitive layer through an original and then processing the exposed photosensitive layer with developing solutions which remove either the exposed or nonexposed areas. Wet development methods are disadvantageous and undesirable because of complicated processing operations and the discharge of polluting solvents and materials.

Images produced in photosensitive polymer compositions without the use of wet developing methods are known in the art. These processes can be based on the alteration of adhesive characteristics of layers and then processed by peel-apart development methods. Examples of such processes are shown in U.S. Pat. Nos. 3,060,023, 3,203,805, 3,445,229, 3,469,982 and 4,123,578. Various compositions on a support are disclosed in these references which are tacky at a given temperature but become nontacky at that temperature after exposure to actinic radiation. These structures may be laminated to a receptor sheet, heated to a given temperature and the receptor sheet peeled off, the tacky composition remaining adhered to the receptor sheet in unexposed areas. The composition that has been exposed to radiation is no longer tacky, and does not adhere to the receptor sheet. That portion remains on the support as a relief image.

Other processes are known in the art which do not require heating to a tackifying temperature. Useful materials according to this type of process are shown in U.S. Pat. Nos. 3,060,023, 3,060,024, 3,353,955, 3,525,615, 3,591,377, 3,607,264, 3,627,529, 4,286,043, 4,291,114 and 4,304,839. The processes which do not require the application of heat to tackify the adhesive rely upon a photopolymerizable and photocurable composition which, in the unexposed condition, has greater adhesion to one of the two supports and, in the exposed condition has greater adhesion to the second support than to the first. U.S. Pat. No. 4,247,619 describes an element comprising a strippable cover sheet, a photosensitive adhered layer and a contiguous layer on a support, the photoadherent layer being a photopolymer which becomes more adhesive to the strippable cover sheet than to the contiguous layer on exposure.

The method of image formation by peeling development as operated in the dry state was extended beyond photopolymerizable monomers or photocurable compounds to compositions containing a photosensitive substance which alters its properties within a binder by U.S. Pat. No. 4,210,711. Thermoplastic photosensitive compositions are described which are not adhesive at ordinary temperatures (5° to about 40° C.) and which give images upon exposure and heat development (from about 50° C. to about 300° C.) while in contact with a peeling development carrier sheet. Peeling of the development carrier sheet from the photosensitive image forming material is performed after light exposure.

British Pat. No. 1,319,295 describes a peeling development method which consists of laminating a heatsoftenable polymeric layer and a powder capable of absorbing infrared rays to a support, exposing the resultant material to infrared rays to impart tackiness imagewise to the heat softenable polymeric layer and separating the polymeric layer from the support to form an image on the support.

In the above-described dry peeling development methods, complementary relief images comprising the photosensitive compositions are left on the support and the peeling development carrier sheets.

Other methods have been disclosed which use dry peeling development to leave a thin layer image of a metal or metal compound on the support. U.S. Pat. No. 4,284,703 discloses a method which uses a support and an adhesive composition layer formed thereon. A metal or chalcogen thin film layer is included between the support and a photosensitive composition layer to form a five-layer laminate structure. Peeling development after exposure induces selective separation at the interface between the non-sensitive thin film layer and the support.

U.S. Pat. No. 4,205,989 describes a peel-development process of imaging based on photoadhesion. According to this process, imaging is accomplished by use of an element consisting of a support, a thin layer of metal or metal compound on the support and, on the thin layer a photosensitive layer consisting of a polymeric film forming binder material and a benzophenone, quinone compound, diazonium compound or azido compound photosensitizer, said photosensitizer layer being capable of decreasing the interfacial adhesion between the metal layer and the photosensitive layer upon exposure to light. When the photosensitive layer is peeled off, a pattern of a thin metal corresponding to the exposed areas remains on the substrate but the unexposed portion of the metal layer is removed. In this manner a negative thin metal layer pattern on the support corresponding to a positive original is obtained. Using the elements according to that invention, a positive thin metal layer image on the support corresponding to a positive original may be obtained by first exposing the element through a positive original, heating the exposed element until the adhesion of the photosensitive layer to the thin metal layer is restored, then exposing the overall element to light, again followed by peeling development. Therefore, a three step process is required to obtain a positive image on the support corresponding to a positive original. In addition, that imaging element may be provided with a supporting layer on the photosensitive layer in order to improve the mechanical strength of the layer to be peeled off. In the commercial application of this imaging element, however, the element is first exposed, then heated in hot water or steam before peeling development. Therefore, a wet processing step is actually incurred before dry peeling development.

U.S. Pat. No. 4,284,703 and publications by Eiichi Inoue, Nippon Shashin Gakkai-Shi, 41 (4), 245–253 (1978) also disclose imaging processes based on photoadhesion. The photosensitive element consists of an adhesive layer between a photosensitive layer and a support and a thin metal or metal compound layer between the photosensitive layer and a second support wherein the combination of the photosensitive element and adhesive element are laminated together either before or after exposure but before peeling development. The photosensitive layer is capable of altering the interfacial adhesion between the photosensitive layer and the thin metal layer. The light-sensitive materials employed in the layer can be classified into two groups. One group consists of high molecular weight material having a cohesive force such that the thin metal layer on the lower support can be removed from the lower support; this group is represented by photo-crosslinkable polymers (e.g. polyvinylcinnamate), photo-decomposable polymers (e.g. a diazo polymer) and photo-destroyable polymers (e.g. polymethyl vinyl ketone). Another group consists of polymeric film forming binders containing low molecular weight photosensitive materials such as aromatic diazonium salts, o-quinonediazides, o-naphthoquinonediazides and aromatic diazide compounds. By means of the proper choice of polymeric film forming binder, photosensitive low molecular weight material, and processing conditions, either negative or positive thin metal layer images are produced on the lower support after peeling development. However, large amounts of photosensitive low molecular weight materials are required in these constructions and consist of 30 to 200% by weight based on the weight of the binder.

U.S. Pat. No. 4,271,256 discloses a method for forming images using a laminate which comprises a recording layer on a plain or subbed support. The recording layer comprises a vacuum deposited layer or multilayer containing at least about 20% by volume of an organic substance. When the organic substance appears as a separate layer it interfaces the support. A recorded image is produced by adhering a strippable film on the surface of the recording layer prior to or after imagewise exposure, and peeling apart the strippable film from the recording layer after imagewise exposure. The exposed area of the recording layer remains on the support and the non-exposed areas are transferred onto the strippable film.

Japanese Pat. No. 80,166,290 discloses a peel-development type imaging material based on the control of adhesion by photochemical decarboxylation reactions. European Pat. No. 42632 describes a recording material wherein the adhesion of a photosensitive binder layer to a metal layer is controlled by a photosensitive material capable of releasing $CO_2$ gas or yielding a hydrohalic acid on exposure to actinic radiation.

A photodelamination imaging process is described by T. Nakayama and K. Shimaya, SPSE, 22, 138 (1978) and British Pat. No. 1,604,525 in which generation of gas ($N_2$) during exposure causes selective delamination.

U.S. patent application Ser. No. 177,287, filed on July 25, 1979 describes peel apart imaging systems based on a change in adhesion produced by the photorelease of surfactant acids from compounds in which the surfactant is blocked by photolabile groups based on the o-nitrobenzyl group.

BRIEF DESCRIPTION OF THE INVENTION

A photosensitive element comprises a substrate carrying at least one photosensitive layer comprising a film forming polymer, a photosensitive acid generator and at least one acid-sensitive surfactant preferably selected from the class of nonionic surfactants, neutral forms of cationic surfactants, amphoteric surfactants or surfactant acid salts.

A particularly desirable photosensitive element comprises at least one frangible, light opaque layer adhered to one surface of an organic polymeric layer which changes its surface activity characteristics by the photoactivated release of acids which act to alter the surface active effects of surfactants within the polymer. The photosensitive organic polymeric layer comprises an organic film forming polymer, a photosensitive acid generator, and at least one surfactant selected from nonionic surfactants, neutral forms of cationic surfactants, amphoteric surfactants, and surfactant acid salts.

The structure with both the frangible layer and photosensitive layer may be combined with one or more support layers for the photosensitive layer and/or the metal layer. It also may be combined with a layer adherent to the frangible light opaque layer with a degree of adherence intermediate the degree of adherence of the frangible, light opaque layer to the exposed and unexposed photosensitive layer.

The dry peel-apart systems of the invention are based upon laminate structures containing at least a photosensitive layer and a substrate. The photosensitive layer is composed of a film forming polymer, a photochemical acid generator, at least one nonionic surfactant, neutral forms of cationic surfactants, amphoteric surfactants, or surfactant acid salt, and optionally a spectral sensitizing compound which is effective with the photochemical acid generator. Exposure of the photosensitive layer changes the surface active properties of the surfactant compound and thereby alters the adhesion of the photosensitive layer to an adjacent layer or the substrate. This change in adhesion may be developed to an image by applying an adhesive layer to the top surface and peeling apart.

Visible images may be produced on the construction of the photosensitive layer on a support by the use of a light-absorbing frangible layer or by a frangible layer to which a toner or dye may be applied subsequently.

DETAILED DESCRIPTION OF THE DRAWINGS

Figure 1:
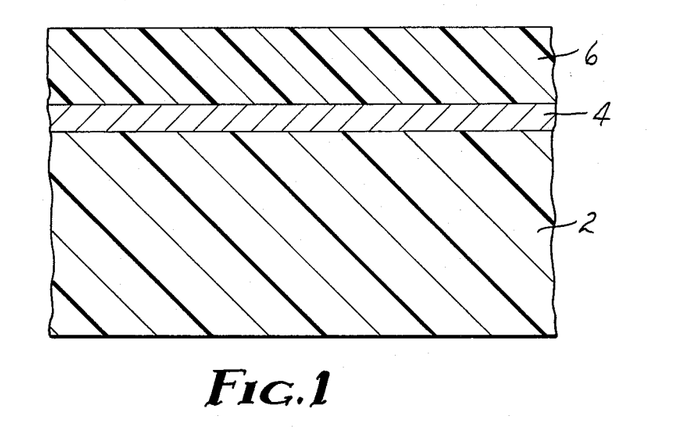
FIG. 1 shows a magnified cross-section of the laminate element, in which 2 is the substrate, 4 is the optional frangible layer and 6 is the photosensitive layer.
Figure 2:
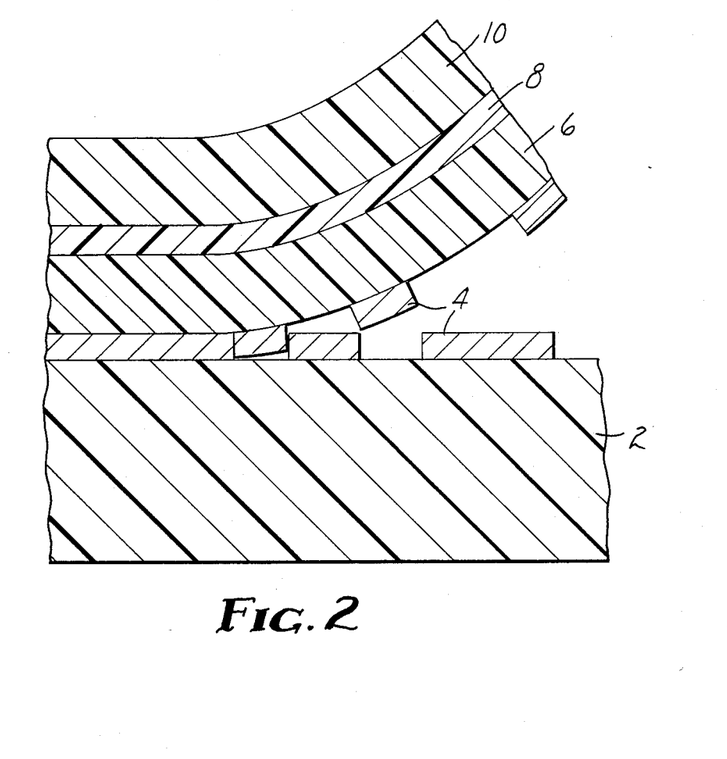
FIG. 2 shows a magnified cross-section of a part of the laminate in which some areas were exposed and other areas were not. A pressure sensitive adhesive (PSA) tape has been applied to the photosensitive layer surface and peel-apart development has been partially completed. Differential adhesion between the frangible layer and the photosensitive layer has resulted from the differential exposure.

The preferred embodiment of the invention shown in FIG. 1 comprises a transparent substrate 2 bearing a layer of opaque frangible material 4 and a photosensitive layer 6 composed of a film forming polymer, an acid-sensitive surfactant and a photochemical acid generator which alters the surface activity of the acid-sensitive surfactant and optionally of a spectral sensitizer. As shown in FIG. 2, exposure to light is capable of decreasing or increasing the interfacial adhesion between the frangible layer 4 and photosensitive layer 6 and an applied adhesive layer 8 and backing 10 can be used for the purpose of peel development of the film from the support. This provides an image of frangible material on the support and a complementary image of frangible material on the peel development layer.

If the interfacial adhesion between layers x and y is represented as $A(x,y)$, and the adhesion value varies with exposure, the exposed adhesion value should be represented by $EA(x,y)$ which is relevant only to layer interfaces (4,6) and (6,8) since layer 6 is the photosensitive layer. The cohesive strength of the layers is represented by $C_2$, $C_4$, etc. in the unexposed state, and $EC_6$ for the photosensitive layer in the exposed state. Referring to FIG. 2 we can say that requirements for good peel-apart imaging are:

$A(2,4) < A(6,8)$, $EA(6,8)$, $A(8,10)$, $C_{10}$, $C_8$, $C_6$, $EC_6$ and $C_2$, and
$C_4 > A(2,4)$
and for positive-acting systems $EA(4,6) > A(2,4) > A(4,6)$ or for negative-acting systems $A(4,6) > A(2,4) > EA(4,6)$.

In addition, for the frangible layer 4, $C_4$ must be sufficiently small and the ductility sufficiently low that edges between exposed and unexposed areas may be sharp and smooth. Thus a positive-acting system (giving a positive image on the substrate 2 requires an acid-sensitive surfactant that changes from high surface activity to low surface activity when the photosensitive layer 6 is exposed with the requisite illumination. Conversely, a negative-acting system requires a change from low to high surface activity on exposure.

DETAILED DESCRIPTION OF THE INVENTION

The support for bearing the photosensitive and frangible image forming layer may be substantially of any solid material including glass, metal, ceramic, paper and film-forming thermoplastic polymeric material capable of accepting a thin layer of metal or inorganic compound thereon. Particularly suitable polymers include polyesters, acetates, polyolefins, polyamides, polyvinyl resins, polycarbonates, polyacrylates, and polymethacrylates such as polyethylene terephthalate, polyethylene, polypropylene, polyvinylchloride, polystyrene, polymethylmethacrylate, polyhexamethylene adipamide (nylon 6), polyvinylidene fluoride and polyvinylidene chloride. The substrate surface may be primed with or without subsequent subbing to reproducibly control the adhesion of the frangible layer to the substrate. For example, titanium dioxide dispersed in a coating solvent may be coated as a thin priming layer on polyester and aluminum then vacuum coated on top of it. Variation of the thickness of the titanium dioxide layer gives controlled variation of the peel-strength adhesion $A(2,4)$ of the aluminum to the substrate. This in turn can give more latitude in the choice of surfactant system and the resultant adhesion values $A(4,6)$ and $EA(4,6)$.

The substrate material may contain therein various additives such as pigment, dyestuff and filler to give write-on properties, opacity and coloration.

The frangible, thin, light opaque layer may be a metal or metal compound layer on the surface of the substrate and may be deposited by a variety of methods, such as vacuum evaporation, cathodic sputtering, electroless plating and electrolyte plating. Substantially all metals may be included such as aluminum, zinc, tin, copper, gold, silver, bismuth, magnesium, chromium, iron and alloys of these metals. Inorganic compounds suitable for the thin layer include metal oxides such as the oxides of aluminum, zinc, tin, chromium and iron, and metal salts such as tin sulfide, zinc sulfide, cadmium sulfide which may be used above or in combination with the previously mentioned metals. The thickness of the metal layer depends on the particular application desired. For example, a thinner layer does not possess sufficient light barrier properties for certain applications and a thick metal layer may give cracking and uneven cleavage along edges and consequent resolution reduction. Metal layers of 5 or 10 to 500 nm preferably may be employed while a thickness of 40-200 nm is more preferred.

The film-forming binder component of the radiation activatable composition of the invention should be thermoplastic organic polymers having a molecular weight of at least 10,000. Suitable polymers include: (a) copolyesters based on terephthalic, isophthalic, sebacic, adipic and hexahydrophthalic acids such as "Vitel" brand polyesters from Goodyear Chemicals, (b) alkyd resins based on phthalic anhydride and glycerine such as EPIC Varnish from Enterprise Paint Company, (c) polyamides such as poly(hexamethyleneadipamide) and polycaprolactam, (d) vinyl acetate polymers such as Air Products' "VINAC" ASB516 and copolymers such as the copolymer with vinyl chloride (or terpolymers with minor amounts of vinyl alcohol), e.g., "VMCH", "VAGH" and "VYHH" from Union Carbide and "GEON" Brand resins from B. F. Goodrich, (e) vinylidene chloride copolymers, (f) ethylene copolymers, e.g., ethylene or propylene and vinyl acetate (or other copolymerizable vinyl monomer), (g) polyacrylates such as polymethylmethacrylate and the copolymers of acrylic acid esters with other ethylenically unsaturated monomers, e.g., "Carboset 525" from B. F. Goodrich Company and "Elvacite" brand methacrylate resins from DuPont Company or terpolymers with minor amounts of dibasic acid, the pressure sensitive adhesive copolymers of "soft" acrylic esters such as butyl or isooctyl acrylate and a "hard" monomer such as acrylic acid or acrylamide, (h) cellulose esters such as cellulose acetate/butyrate, (i) polyvinyl acetals such as polyvinyl butyral, polyvinyl formal, (j) polyurethanes such as B. F. Goodrich Company "Estane 5715", (k) polycarbonates, (l) styrene/maleic anhydride or maleic acid copolymers, and (m) phenoxy resins such as Union Carbide's "Bakelite" brand "PKHH", "PKHC" and "PKHA".

Acid-sensitive surfactants as defined in the present invention are surfactants that alter the adhesive characteristics of a film-forming binder differently before and after interaction with acid. The Malstan test described below functionally defines acid-sensitive surfactants. According to that test, a candidate film-forming binder and surfactant mixture is coated onto a metallized (e.g., aluminized) surface. A firmly adherent metal coating must be used in this procedure. The peel force necessary to strip the dried coating from the metallized surface pulling at a 180° angle at a rate of 2 cm/sec. is determined. An adhesive tape (such as 3M Scotch ® Brand Transparent Tape) may be used to grasp the film. The same coating composition containing an additional one percent by dry coating weight of hydrochloric acid is subsequently coated onto an identical surface and the peel force measured in the same manner. If the acid-containing composition has a peel force less than or more than that of the acid-free coating by at least fifteen percent and if any portion of the difference between those peel forces lies between 0.8 and 40 g/cm, the Malstan test is satisfied. The preferred Malstan test requires that some portion of the difference between those peel forces lies between 2 and 30 g/cm. The peel force determined according to these tests are respectively referred to as the Malstan value (M) and the Preferred Malstan value ($M_p$). The Malstan value and Preferred Malstan value for non-acidified (subscript "n") and acidified (subscript "a") compositions are designated as $M_n$, $M_a$, $M_{pn}$ and $M_{pa}$.

The criticality of these Malstan values can be readily seen if the dynamics of the process are analyzed. The metal layer on the substrate must be strippable from the substrate at a peel force between 0.8 and 40 g/cm in order to provide a useful imaging base. A lower degree of adhesion would allow the entire metal layer or portions thereof to be too readily removed and a higher degree of adhesion would be too difficult to remove. The process of forming an image requires a change in the Malstan value so that it becomes greater than or less than the adhesion value for the metal layer to the substrate (A(2,4)) where it initially was respectively less than or greater than A(2,4). As the value of A(2,4) must be between 0.8 and 40 g/cm, the range of Malstan values between non-acidified and acidified binder/surfactant compositions must include a portion of that 0.8 to 40 g/cm range if it is to be capable of overlapping and extending both above and below the adhesion value A(2,4) of the metal to the substrate. The Malstan test thus provides a simple and efficient test for useful materials. Succinctly put, acid-sensitive surfactants are those surfactants which, when present in an organic polymeric binder, provide the binder/surfactant composition with a range between its $M_n$ and $M_a$ which overlaps at least a part of 0.8 to 40 g/cm.

In the use of photochemical acid generators, the peel strength of the unexposed photosensitive layer to said light-opaque layer is less than or greater than the peel strength of said light-opaque layer to said substrate, and the peel strength of the photoactivated photosensitive layer to said light-opaque layer respectively becomes greater than or less than the peel strength of said light-opaque layer to said substrate.

The surfactant acid salts used in this invention are surfactant acids (i.e., compounds having a hydrophobic group and at least one acid group) having their ionizable polar group(s) (acid group) masked through an ionic bond; i.e., in their salt form. By choice of the particular salt form of the surfactant, the surfactant salt can have substantially different surface activity towards the metal layer of the substrate than the acid form of the surfactant when compared at equal concentrations in the photosensitive layer of the present invention. By exposure of the photosensitive acid generator to suitable radiation the surface activity of the surfactant salt (and thus the photosensitive resin) is altered and this changes the adhesive strength between the metal layer and the photosensitive resin layer and salts. Representative acid groups include carboxylic, sulfonic, sulfinic, phosphate, phosphinic and phosphonic (the mono- and di-esters of all are included) phosphinic and sulfuric acid groups.

Other surfactants of use in the present invention are those surfactants which, in their salt form, are commonly known as anionic surfactants. Suitable anionic surfactants are those having one or more salt forming polar groups which in their salt form include carboxylate, sulfonate, sulfate, sulfinate, phosphite, phosphate, phosphonate, phosphinate and the like polar groups as is described, for example, in the publications entitled *Anionic Surfactants, Parts I and II*, edited by Warner M. Linfield, published in 1976 by Marcel Dekker, Incorporated, New York.

Non-ionic surfactants, containing hydrophilic groups in addition to their hydrophobic groups are also useful as acid-sensitive surfactants. Preferred classes of non-ionic surfactants include those containing polyoxyalkylene groups such as polyoxyethylene or mixed polyoxyethylene and polyoxypropylene groups, polyethylene glycols, alkanol amides, alkanol sulfonamides, and trialkyl phosphites.

The neutral form of cationic surfactants are also particularly useful. These are materials which can be cationic surfactants upon acceptance of a proton, but are not in that charged state. They are well documented in the art.

Amphoteric surfactants are also useful. These are surfactants having at least two groups thereon, one of which is capable of becoming positively charged by tautomerization or acceptance of a proton and the other of which is capable of becoming negatively charged by ionization or donation of a proton. Amphoteric surfactants also include those surfactants having both of those groups so charged.

The surfactants may generally be used in an amount of from 0.2 to 10 percent by dry weight of the photosensitive layer, preferably as 0.4 to 7 percent by dry weight of the layer.

In general, the acid-sensitive surfactant may be used in the range 0.1 to 5% by weight of the binder resin, preferably 0.15 to 3%. In practice, the optimum concentration of surfactant salt must be determined for each surfactant salt. For negative-acting image forming films, too high a concentration of surfactant salt causes the adhesion of the photosensitive resin binder layer to the metal layer to be substantially reduced prior to exposure and development; too low a concentration of surfactant salt will not provide sufficient surfactant acid after exposure to substantially reduce the adhesion. For positive-acting image forming films, too high a concentration of surfactant salt causes the adhesion of the photosensitive resin layer to the metal layer to be so reduced that exposure of the film will not restore sufficient adhesion between the photosensitive layer and metal layer; too low a concentration of surfactant salt will not sufficiently lower the adhesion before exposure. The photographic speeds of the systems are, therefore, partly dependent on the surfactant salt concentrations.

To provide the best image resolution, the $M_a$ should differ from the adhesive value of the metal to the substrate by at least 10%. Thus, in a negative acting system $M_a > A(2,4)$ by at least 10% and in a positive acting system $M_a < A(2,4)$ by at least 10%. The $M_n$ should also be, respectively, less than and greater than the adhesive value of the metal to the substrate by at least 10% for negative and positive acting systems. Preferably these differences should be at least 15% and more preferably at least 25%.

If certain positive-acting surfactants, such as Aerosol 501 (di-sodium salt of an alkylsulfosuccinate) are subjected to chemicals which alter their composition (as by reaction with acids in the case of Aerosol 501), they may become negative-acting surfactants. The altered form would, of course, still satisfy the Malstan test if it did become a negative-acting system.

Preferred surfactant acid salts for use in the composition of this invention have the general formula $(Y-X)_a R$ wherein X is a polar group selected from and "a" is a number 1 to 4, preferably 1 or 2 and most preferably 1.

Preferred surfactant acid salts are chosen by the criterion of the critical micelle concentration which is defined as the concentration that must be reached in order that micelles are formed from surfactants molecularly dispersed in an aqueous solution. The CMC of a surfactant acid salt is often used as a measure of its surface activity and thus its tendency to absorb at interfaces. Methods for determination of CMC's may be found, for example, in the publication "Solution Chemistry of Surfactants" edited by K. L. Mittal, Plenum Press, New York, 1979. Published data of critical micelle concentrations may be found, for example, in the publications entitled "Critical Micelle Concentrations of Aqueous Surfactant Systems" by P. Mukerjee and K. Mysels, NSRDS-NBS 36, National Bureau of Standards, Washington, D.C., 1971; "Surfactants and Interfacial Phenomena" by M. J. Rosen, John Wiley and Sons, New York, 1978; "Surface Active Ethylene Oxide Adducts" by N. Schonfeldt, Pergamon Press, Braunschweig, 1969 and "Polymer Handbook, Second Edition" edited by J. Brardrup and E. H. Immergut, John Wiley and Sons, New York, 1975.

For surfactant acid salts which give negative-acting imaging films in this invention, the preferred R and $R^1$ are hydrophobic groups such that the surfactant acid $(H-X)_a R$ has a log CMC (critical micelle concentration) equal to or less than $-2$ ($\log_{10}(CMC) \leq -2$). For surfactant acid salts which give positive acting imaging films in this invention, the preferred R and $R^1$ are hydrophobic groups such that the $\log_{10}(CMC)$ is $\leq +0.3$. R is selected from:

(a) straight chain alkyl, alkenyl, alkynyl or alkylphenyl groups having 12 to 30 carbon atoms when X is or 7 to 30 carbon atoms when X is or perfluoroalkyl, -alkenyl or -alkynyl groups having 7 to 30 carbon atoms for or 3 to 30 carbon atoms for (b) $R^2 CO_2(CH_2)_m-$, $R^2 CON(R^3)(CH_2)_n-$, $R^2 O_2 C(CH_2)_n-$ or $R^2 CH-$
$\phantom{R^2}|$
$CH_2 OH$ where $R^2$ is a straight chain alkyl, alkenyl, alkynyl or alkyphenyl group having 11 to 30 carbon atoms or a perfluoroalkyl group having 3 to 30 carbon atoms, $R^3$ is hydrogen or lower alkyl having one to four carbon atoms, m is 2–4 and n is 1–3.

(c)

where $R^4$, $R^5$ are straight chain alkyl, alkenyl, alkynyl, alkyphenol groups having 6 to 30 carbon atoms or perfluoroalkyl, -alkenyl or -alkynyl groups having 3 to 30 carbon atoms or Y, but both cannot be Y simultaneously.

(d) $R^6 CO(CH_2)_p$ or $R^6 CH(OH)(CH_2)_p$ where $R^6$ is a straight chain alkyl, alkenyl, alkynyl or alkylphenyl group having 11 to 30 carbon atoms or perfluoroalkyl groups having 3 to 30 carbon atoms and p is 1–2.

(e)

where $R^7$ is a straight chain alkyl, alkenyl, alkynyl or alkylphenyl group having 12 to 30 carbon atoms or perfluoroalkyl, -alkenyl or -alkynyl groups having 3 to 30 carbon atoms, $R^8$ is hydrogen or lower alkyl having 1–2 carbon atoms and q is 1 to 10.

$R^1$ is hydrogen, alkyl, alkenyl, alkynyl or alkylaryl having 1 to 11 carbon atoms or R.

Y is a mono- or di-valent cation of the alkali and alkaline earth metals and transition metals including preferably $Li^+$, $Na^+$, $K^+$, $Cs^+$, $Zn^{+2}$, $Pb^{+2}$ and nitrogen centered cations with the general formula $^+NR_4^9, Ar^+$ wherein $R^9$ is hydrogen, aryl, straight, branched or cyclic alkyl, straight, branched chain or cyclic alkenyl or where two or three $R^9$ groups are joined together to form a ring(s) wherein N is part of the ring(s); and $Ar^+$ is a mononuclear or polynuclear heteroaromatic group having 5 to 13 carbon atoms and at least one heteroatom is nitrogen, the nitrogen of which is quaternized with hydrogen or alkyl groups of one to four carbon atoms. In addition, anionic surfactants found useful in the present invention are represented by a wide variety of classes containing the groups as is described, for example, in the publications entitled *Anionic Surfactants, Parts I and II*, edited by Warner M. Linfield, published in 1976 by Marcel Dekker, Incorporated, New York. Suitable anionic surfactants have been found, for example, among alcohol and ether alcohol sulfates, sulfated fats and oils, alkylarylsulfonates, alpha-sulfomonocarboxylic acids, sulfopolycarboxylic acid derivatives, sulfoalkyl esters and amides of fatty acids, phosphorous-containing anionic surfactants, N-acylated amino acids and sulfated monoglycerides and alkanolamides.

Examples of specific preferred surfactant acid salts of the present invention include those listed in Table I.

TABLE I

| | |
|---|---|
| 1. | Potassium perfluorooctane sulfonate |
| 2. | Potassium hexadecane sulfonate |
| 3. | Ammonium perfluorooctane sulfonate |
| 4. | Pyridinium perfluorooctane sulfonate |
| 5. | Lead bis(perfluorooctane sulfonate) |
| 6. | Potassium perfluorooctanoate |
| 7. | Potassium perfluoro-4-ethylcyclohexane sulfonate |
| 8. | Sodium 1-dodecylbenzene sulfonate |
| 9. | Coconut acid ester of sodium isethionate |
| 10. | Ammonium perfluorooctanoate |
| 11. | Ammonium oleate |
| 12. | Ammonium stearate |
| 13. | Lead bis(perfluorooctanoate) |
| 14. | Zinc bis(perfluorooctanoate) |
| 15. | Cesium perfluorooctanoate |
| 16. | Tetra-n-butyl ammonium perfluorooctanoate |
| 17. | Ammonium salt of N—octadecanoylsarcosine |
| 18. | Ammonium salt of N—perfluorooctanoylsarcosine |
| 19. | n-Butyl ammonium perfluorooctanoate |
| 20. | Diethyl ammonium perfluorooctanoate |
| 21. | Piperidinium perfluorooctanoate |
| 22. | Pyridinium perfluorooctanoate |
| 23. | Anilinium perfluorooctanoate |
| 24. | Benzylammonium perfluorooctanoate |
| 25. | Morpholinium perfluorooctanoate |
| 26. | t-Butyl ammonium perfluorooctanoate |
| 27. | Ethyl-n-butyl ammonium perfluorooctanoate |
| 28. | Dicyclohexylammonium perfluorooctanoate |
| 29. | Ethylammonium perfluorooctanoate |
| 30. | Ethylenediamine salt of perfluorooctanoic acid |
| 31. | Pyridinium perfluorobutyrate |
| 32. | Pyridinium perfluorohexanoate |
| 33. | Sodium dioctylsulfosuccinate |
| 34. | Triton ® 770 concentrate (sodium salt of alkylaryl polyether sulfate, Rohm and Haas Co.) |
| 35. | Actrasol ® SR75 (sulfated oleic acid, Southland Corp., Chem. Div.) |
| 36. | Magnesium bis(perfluorooctane sulfonate) |
| 37. | Sodium perfluorooctane sulfinate |
| 38. | Potassium perfluorodecane sulfonate |
| 39. | Piperidinium octanoate |
| 40. | 2,2'-Bipyridinium mono(perfluorooctanoate) |
| 41. | Sipon EA (ammonium lauryl ether sulfate, Alcolac, Inc.) |
| 42. | Sipon L-22 (ammonium salt of lauryl sulfate, Alcolac, Inc.) |
| 43. | Actrasol ® PSR (sulfated castor oil, Southland Corp., Chem. Div.) |
| 44. | Hipochem Dispersol SB (sulfated butyl oleate, High Point Chemical) |
| 45. | Acrilev AM-Special (phosphate ester, potassium salt, Finetex, Inc.) |
| 46. | Fosfamide N (complex fatty amido phosphate, Henkel Corp.) |
| 47. | Fosterge LFS (sodium salt of mono- and di-alkylphenoxy polyoxyethylene acid phosphates, Henkel Corp.) |
| 48. | Fosterge RD (diethanolamine salt of mono- and di-alkyl (fatty) acid phosphates, Henkel Corp.) |
| 49. | Victawet 58B (phosphorated higher alcohol, Stauffer Chem. Co.) |
| 50. | $(C_8F_{17}SO_2N(C_2H_5)C_2H_4O)_2PO_2NH_4$ |
| 51. | $C_{17}H_{35}CH(OH)SO_3Na$ |
| 52. | Aerosol A-103 (disodium ethoxylated nonylphenol half ester of sulfosuccinic acid, American Cyanamid) |
| 53. | Aerosol 501 (disodium alkylsulfosuccinate, American Cyanamid) |

The nonionic surfactants found useful in the present invention are represented by a wide variety of classes, as is described, for example, in the publications entitled *Nonionic Surfactants*, edited by Martin J. Schlick, published in 1967 by Marcel Dekker, Incorporated, New York and *McCutcheon's Emulsifiers and Detergents*, North American Edition, 1981, published by MC Publishing Company, New Jersey. Preferred nonionic surfactants have been found, for example, among polyoxyethylene alkylphenols, polyoxyethylene alcohols, polyoxyethylene mercaptans, polyoxyethylene esters of fatty acids, polyoxyethylene derivatives of alkylamides, polyoxyethylene alkylsulfonamides, polyoxyethylene derivatives of polyol surfactants, polyoxyethylene derivatives of acetylenic glycols, polyoxyethylene derivatives of fluorinated hydrophobes, and condensates of ethylene oxide with hydrophobic bases formed by condensing propylene oxide with propylene glycol.

More preferable nonionic surfactants containing polyoxyethylene groups are the water soluble nonionic surfactants found among the previously mentioned classes of nonionic surfactants containing polyoxyethylene groups. Furthermore, water soluble polyethylene glycols, which are not strictly defined as surfactants by themselves, are also preferably suitable in the composition of this invention.

Preferable nonionic surfactants not containing polyoxyethylene groups have been found among the fatty alkanolamides, fatty alkanosulfonamides and those represented by the formula $(R^{10}O)_3P$ where $R^{10}$ is alkyl, alkenyl, alkynyl or aryl of 6 to 30 carbon atoms or fluoroalkyl, -alkenyl or alkynyl of 4 to 30 carbon atoms, and bis-hydroxyethyl esters of dicarboxylic acids, e.g., $HOCH_2CH_2O_2CC_nH_{2n}CO_2CH_2CH_2OH$ where n is 6 to 8.

By "water soluble" it is meant that the hydrophilic-lipophilic balance (as is well known in the art and literature and referred to as the HLB value) is greatear than 10.5. For fluorinated nonionic surfactants, the solubility should be greater than 0.5% in water.

In general, the nonionic surfactant may be used in the range 0.5 to 10% by weight of the binder resin, preferably 1 to 6%. Too high a concentration of nonionic surfactant, either alone or in combination with a surfactant acid salt, will cause adhesion of the photosensitive resin layer to the metal layer to be substantially reduced prior to imaging.

Suitable examples of nonionic surfactants are given in the following table.

TABLE II

| | |
|---|---|
| Triton X-100 | (Octylphenoxy polyethoxy ethanol, Rohm and Haas Co.) |
| Tergitol NPX | (Nonylphenol polyethylene glycol ether, Union Carbide Corporation) |
| Igepal CM-710 | (Dialkylphenoxy poly(ethyleneoxy) ethanol, GAF Corp.) |
| Tergitol 15-S-9 | Polyethylene glycol ether, 2° alcohol, Union Carbide Corp.) |
| Brij 35 | (Polyoxyethylene lauryl ether, ICI Americas, Inc.) |
| $CH_3O(CH_2CH_2O)_nH$ | where n = 3 to 100 |
| Siponic SK | (Polyoxyethylene mercaptan, Alcolac Inc.) |
| Tween 20 | (Polyoxyethylene sorbitan monolaurate, ICI Americas, Inc.) |
| Tween 65 | (Polyoxyethylene sorbitan tristearate, ICI Americas, Inc.) |
| Emsorb 6900 | (Polyoxyethylene sorbitan monooleate, Emery Industries) |
| Emsorb 6905 | (Polyoxyethylene sorbitan monostearate, Emery Industries) |
| Trylox 6747 | (Polyoxyethylene sorbitol hexaoleate, Emery Industries) |
| Myrj 52 | (Polyoxyethylene stearate, ICI Americas, Inc.) |
| Surfyrol 440 | (Polyoxyethylated acetylenic glycol, Air Prdcs. & Chem., Inc.) |
| FC 170C | (Fluorinated hydrophobe, 3M) |
| Pluronic P104 | (condensate of ethylene oxide with condensate of propylene oxide and propylene glycol, BASF) |
| Carbowax series 200–4000 | (Polyethyleneglycols, average MW 200–4000, Union Carbide Corp.) |
| 9-Octadecenamide | (alkanolamide, Witco Chem. Corp) Witcamide 5138 |
| $C_8F_{17}SO_2N(R)C_nH_{2n}OH$ | where R is alkyl of 1 to 4 carbon atoms and n is 2 to 11. |
| Phenyldidecylphosphite | (tridecylphosphite, Witco Chem. Corp.) Mark TDP |

Also found useful in the present invention are the neutral form of cationic surfactants (so named for their ability to form cations) and amphoteric surfactants as are described, for example, in the publications entitled *Cationic Surfactants*, edited by Eric Jungermann, published in 1970 by Marcel Dekker, Incorporated, New York, and *McCutcheon's Emulsifiers and Detergents*, North American Edition, 1981, published by MC Publishing Company, New Jersey. Suitable neutral cationic surfactants are represented by the tertiary amine oxides and the following amines and diamines:

where R is a straight or branched chain alkyl, alkenyl or aryl alkyl group having 12 to 24 carbon atoms, $R^1$ is H, $CH_3$ and $R^2$ is H or polyoxyethylene as represented by the polyoxyethylene alkylamines and n is 3. Suitable examples of neutral cationic surfactants are listed in Table III.

TABLE III

Kemamine P-190D (90% $C_{10}H_{21}NH_2$ + 10% $C_{18}H_{37}NH_2$ primary amine, Humko Chemical Division, Witco Chemical Corporation)

Duomeen O (N-oleyl trimethylene diamine, Armak Industrial Chemical Division)

Katapol PN-430 (polyoxyethylated alkyl amine, GAF Corporation)

Aromox DMCD (dimethylcocoamine oxide, Armak Industrial Chemical Division)

Aromox 18/12 (bis(2-hydroxyethyl)octadecylamine oxide, Armak Industrial Chemical Division)

Suitable examples of amphoteric surfactants are given in the following table.

TABLE IV

Schercoteric MS-SF (coco imidazolinium derivative monocarboxylate, Scher Chemicals, Incorporated)

Hipochem CAD (emulsified aromatic ester, High Point Chemical)

Monateric ADA (coco amidopropyl betaine, Mona Industries, Incorporated).

In general, the neutral cationic surfactant and amphoteric surfactant may be used in the range 0.2 to 6.0% by weight of the binder resin, preferably 0.3 to 3.0%.

Photoactivators suitable for the present invention are photochemical acid generators. A large number of known compounds and mixtures, such as diazonium salts, aromatic sulfonium and iodonium salts as described in U.S. Pat. No. 4,250,053, photolabile halogen compounds and diazo oxides may be used as photochemical generators of acids. These are usually present as 0.5 to 10% by dry weight of the layer, and preferably as 1 to 8% by dry weight of the layer.

The diazonium, sulfonium and iodonium compounds are used in the form of salts soluble in organic solvents, normally as the salts produced from strong acids such as tetrafluoroborate, hexafluorophosphate, hexafluoroantimonate and hexafluoroarsenate.

Alternatively the mixed salt resulting from combinations of sulfonium, iodonium or diazonium cation and the anionic form of the surfactant acid may be used to give the photochemical acid generator and the surfactant acid salt in the same associated salt.

In principle, organic halogen containing compounds capable of splitting off a hydrohalic acid (i.e., an organic compound having a photolabile halogen) may be used and in general these are compounds containing one or more halogen atoms attached to a carbon atom or an aromatic ring and include polynuclear-chromophore substituted halomethyl-s-triazines as disclosed in 3M U.S. patent application Ser. No. 121,403, filed Feb. 14, 1980, U.S. Pat. No. 4,329,384.

Examples of suitable photoactivators are listed in the following table.

TABLE V triphenylsulfonium hexafluoroantimonate 4-(phenylthiophenyl)diphenylsulfonium hexafluoroantimonate 4-(phenylthiophenyl)diphenylsulfonium hexafluorophosphate 4-(phenylthiophenyl)diphenylsulfonium tetrafluoroborate 4-(phenylthiophenyl)diphenylsulfonium trifluoromethyl sulfonate diphenyliodonium hexafluorophosphate diphenyliodonium triisopropylnaphthalene sulfonate
bis-trimethylphenyl iodonium hexafluorophosphate
diphenyliodonium hexafluoroarsenate
2-methyl-4,6-bistrichloromethyl-S-triazine
2-(4-methoxystyryl)-4,6-bistrichloromethyl-S-triazine
4,5-dimethoxy-2-nitrobenzyl chloride
carbon tetrabromide
hexabromoethane
2,2,2-tribromoethanol
1-diazo-2,5-diethoxy-4-(p-tolyl-mercapto)-benzene hexafluoroantimonate
1-diazo-2,5-diethoxy-4-benzamido-benzene hexafluoroantimonate and the aromatic diazo-oxide compounds, for example, naphthoquinone diazides.

Suitable examples of mixed photochemical acid generator-surfactant acid salt useful in the present invention are:
4-(phenylthiophenyl)diphenyl sulfonium salt of the coconut acid ester of isethionate
4-(phenylthiophenyl)diphenyl sulfonium perfluorooctanoate diphenyliodonium perfluorooctane sulfonate
diphenyliodonium salt of the coconut acid ester of isethionate.

Several of the above-mentioned photoactivators are sensitive only to shorter wavelengths in the ultraviolet region of the electromagnetic spectrum (250-350 nm) but may be sensitized to longer wavelengths of the ultraviolet, visible, and near infrared regions of the spectrum (350-850 nm). Suitable photosensitizers for photolyzable organic halogen compounds, sulfonium and iodonium salts are well known in the art as disclosed, for example, in U.S. Pat. Nos. 3,729,313, 3,741,769, 3,808,006 and 4,250,053.

The formation of negative thin metal layer images on the substrate 1 (FIG. 1) can be accomplished by exposing the photosensitive resin layer 6 containing only a photochemical acid generator in the absence of a surfactant followed by heat and in the absence of a surfactant acid salt or nonionic surfactant followed by heat and peeling apart development. Therefore, the photochemically generated acid serves to reduce the adhesion between the photosensitive resin layer 6 and the metal layer 4. However, the quality of the thin metal image formed in this manner is very poor and, furthermore, no metal images are formed if the development temperature is too high (80°-130° C.) and/or the films have aged; i.e., development latitude is poor and poor shelf-life results. Shelf-life, development latitude and image quality for negative-acting films can be improved by the incorporation of photochemical acid generators and surfactants in the photosensitive resin layer. Furthermore, positive thin metal layer images on the substrate 1 (FIG. 1) have only been achieved when a surfactant is present with a photochemical acid generator in the photosensitive resin layer 6. Therefore, the surfactants incorporated in the photosensitive resin layer give important advantages to the imaging process and are essential to the commercial success of the presently described invention.

According to this invention, positive- or negative-acting films can be prepared by the appropriate combination of surfactant, photoactivator and film-forming binder. For example, in Vitel PE222, a polyester resin from Goodyear Chemicals, positive-acting films are obtained from the combination of ammonium perfluorooctanoate and triphenylsulfonium hexafluoroantimonate or pyridinium perfluoroactanoate and diphenyliodonium hexafluorophosphate or octadecylamine and triphenylsulfonium hexafluoroantimonate. Negative-acting films are obtained, for example, from ammonium perfluorooctanoate and diphenyliodonium hexafluorophosphate or ammonium perfluorooctane sulfonate and triphenylsulfonium hexafluoroantimonate or tetrabutyl ammonium perfluorooctanoate and triphenylsulfonium hexafluoroantimonate or the mixed surfactant acid-photochemical acid generator salts triphenylsulfonium perfluorooctanoate or diphenyliodonium perfluorooctanoate. A negative-acting film is obtained from FC-430 and diphenyliodonium hexafluorophosphate in Vitel PE 222. A positive acting film is obtained from FC-430 and diphenyliodonium hexafluorophosphate in Vinac B-100, a vinyl acetate polymer from Air Products.

In order to more fully understand the role of the surfactant in the present invention and in order to predict the mode of imaging (whether negative- or positive-acting) resulting from each surfactant, the following classifications are given to the different surfactant types. Sulfate and sulfonate surfactant salts give negative-acting imaging, while carboxylate, phosphate and sulfinate surfactant salts generally give positive-acting imaging, although there are exceptions. The fatty amine, fatty amine oxides and amphoteric surfactants generally give positive-acting imaging, whereas the remainder of the nonionic surfactants cited above give negative-acting imaging. These classifications are construed only for the purpose of predicting the mode of imaging, whether negative or positive. The actual mode of imaging within the constructions of this invention must be empirically determined for each surfactant in combination with the other components used in the photosensitive resin layer.

The proposed mechanism for negative image formation by anionic surfactants is given by equations 1 and 2:

(1)

(2)

wherein the surfactant acid X—X—R serves to reduce the adhesion between the photosensitive resin layer and the metal layer and the log (CMC) for H—X—R is preferably less than −2.

The proposed mechanism for positive image formation by anionic surfactants illustrated for a resin binder containing pendant carboxylic acid groups is given by equations (3)-(5).

(3)

(4)

(5)

-continued

According to equation (3), adhesion of the photosensitive resin layer to the metal layer is reduced due to the combination of two factors, conversion of carboxylic acid groups on the resin to their salt form, thereby reducing the inherent adhesion of the resin to the metal layer, and the presence of the surfactant acid H—X—R. Therefore, for the positive-acting film, the surfactant strength of the surfactant acid H—X—R does not have to be as great as for the negative-acting films, and the preferred log (CMC) may be greater than $-2$ but is less than $+0.3$. Acid generated photochemically (equation (4)) reprotonates the carboxylate groups of the resin (equation (5)), thereby restoring the inherent adhesion between the resin layer and the metal layer. The equilibrium established in equation (3) must lie far enough to the right to reduce adhesion between the photosensitive resin layer and the metal layer and is dependent on the acid strength of the surfactant acid formed relative to the acid strength of the carboxylic acid groups of the resin. Strong surfactant acids, such as sulfonic acids, drive the equilibrium of equation (3) far to the left and cannot give positive image formation, whereas weaker surfactant acids, such as carboxylic and phosphoric, allow this equilibrium to proceed far enough to the right to give positive image formation.

The equilibrium of equation (3) may also be affected by the presence of other components in the composition of this invention; e.g., other ions. For example, $Ar_3SSbF_6$ (a combination of approximately 50% $\phi S \phi S \oplus \phi_2 SbF_6$, 45% $\phi_3 SSbF_6$ and 5% $Cl\phi S\phi_2 SbF_6$) gives positive image formation with $C_7F_{15}CO_2NH_4$ whereas $\phi_2IPF_6$ gives negative image formation with this same ionic surfactant. This is thought to be due to the metathesis established in equation (6) and the subsequent failure of $\phi_2IC_7F_{15}CO_2$ to enter into an equilibration with the carboxylic acid groups of the resin. The hypothetical metathesis established by equation (7) apparently does not occur since the salt $Ar_3SC_7F_{15}CO_2$, prepared by independent synthesis, gives negative image formation.

$$\phi_2IPF_6+C_7F_{15}CO_2NH_4 \rightleftharpoons \phi_2IC_7F_{15}CO_2+NH_4PF_6 \qquad (6)$$

$$Ar_3SSbF_6+C_7F_{15}CO_2NH_4 \rightleftharpoons Ar_3SC_7F_{15}CO_2+NH_4SbF_6 \qquad (7)$$

The proposed mechanism for positive image formation by fatty amine surfactants is again illustrated for a resin binder containing pendant carboxylic acid groups and is given by equations (8)–(10).

(8)

Photochemical acid generator $\xrightarrow{h\nu} H^+$ (9)

(10)

The acid-base reaction between the carboxylic acid groups of the resin and the fatty amine to form the salt (equation (8)) serves to reduce the inherent adhesion of the resin to the metal layer. Photochemically generated acid (equation (9)) reprotonates the carboxylate groups, thus restoring the inherent adhesion of the resin to the metal layer.

Mobility within the photosensitive resin layer may be important in the reactions of this invention and may be maintained by the incorporation of plasticizers in the photosensitive resin layer. Particularly suitable plasticizers include dioctyl phthalate, di-2-ethylhexyl sebacate, diethylene glycol mono ethyl ether and hindered phenols such as 2,6-di-tert-butyl-4-methyl phenol. The plasticizer can be used in an amount from about 3 to 12%, preferably 6 to 9% by weight of the resin binder.

The radiation sensitive coating composition of this invention is prepared by mixing by any convenient method the film-forming binder, the surfactant and the photoactivator in a suitable solvent. Generally, from about 1 to 12 parts, preferably about 2 to 9 parts photoactivator, about 0.1 to 12 parts, preferably about 0.5 to 9 parts photosensitizer, and about 0.1 to 5 parts, preferably about 0.2 to 3 parts surfactant are used per 100 parts of film-forming binder. Solutions are prepared to contain about 10 to 50 weight percent concentration of solids, the concentration used being that which provides a solution having a viscosity most suitable to the methods by which the composition is to be applied to the substrate or the frangible layer on the substrate.

Solvents for use in the coating composition are chosen on the basis of the solubility of the film-forming binder. Particularly suitable solvents include ketones such as acetone, methyl ethyl ketone, and methyl isobutyl ketone; aromatic hydrocarbons such as benzene and toluene; halocarbons such as chloroform, methylene chloride, and trichloroethylene; esters such as ethyl acetate and propyl butyrate; ethers such as diethyl ether, dioxane, tetrahydrofuran and cellosolve acetate; nitromethane; nitroethane; dimethyl sulfoxide; and acetonitrile.

Various additives, such as coating aids, wetting agents not active in the peel-apart process, ultraviolet absorbers and dyes (as long as they do not absorb in the wavelength range of the photoactivator or photosensitizer) can be added to the composition in amounts and for purposes that are well known. Particulate material such as pigments; e.g., carbon black, clays, titanium dioxide, umber, ochre and the like, microfibers, glass microspheres, alumina, silicas, etc., can be added; however, only small amounts; i.e., less than about 5%, can be tolerated since the surfactant acid produced on irradiation will tend to orient about particulate material and be lost to orientation at the substrate surface.

The substrate can be coated by any of the conventional means, including spray, brush, dip pad, roll-coating, curtain and knife techniques, and may, if desired, be dried under ambient or oven conditions to provide coating films on the substrate. The coating material is applied in such an amount that the dried photosensitive layer is from about 1μ to 100, preferably 10 to 40μ, thick.

The image producing element according to this invention is exposed to light through a desired pattern and subjected to a dry heat development and the photosensitive layer is peeled off to produce a metal image corresponding to the original pattern on the substrate. Suitable radiation sources include carbon arcs, mercury arc lamps, fluorescent lamps with ultraviolet or visible radiation-emitting phosphors, argon and xenon glow lamps, tungsten lamps, metal halide arc lamps or electronic flash units. The period for which the image producing element is exposed to light varies depending upon the type of photosensitive layer, the wavelength emitted from the light source and the illumination level. Mercury vapor arcs and tungsten lamps customarily used in the graphic arts and printing industries are used at a distace of 1 to 20 inches or more from the photosensitive layer to bring about release. Total radiation fluxes of 10 to 10,000 μw/cm are generally suitable for use.

Dry heat development of the imaged films of this invention may be accomplished by a variety of methods including heated rollers, heated plates, heated air and infrared heat sources. The period for which the imaged film is subjected to heat varies depending on the type of photosensitive layer, the exposure time and the temperature of the heat sources. Exposure and heat development of the film of this invention may be done sequentially or simultaneously.

After exposure and heat development the film is peeled apart with the aid of a pressure sensitive adhesive tape or a heat activatable laminating film, such tape or laminating film being applied to the surface of the photosensitive layer either prior to exposure and heat development, after exposure but before heat development or after exposure and heat development. The peeling action may be done either manually or mechanically.

The following examples will aid in further explaining, but should not be deemed as limiting, the instant invention. In all cases, unless otherwise noted, all weights are percentages by weight.

In the examples, the following contracted terms may be used.

1. "Wedge exposure 107"—exposure of the material for the specified time behind and in contact with a 21 step wedge tablet composed of neutral absorbers giving a 0.14 density step interval. An illumination level of 100,000 lux at the front surface of the wedge tablet was provided by a tungsten lamp running at a color temperature of about 2900° K. These conditions were provided by a 3M Model 107 exposure unit.
2. "Wedge exposure 70"—exposure similar to 1 except that the illumination level was about 183,000 lux. These conditions are provided by a 3M Model 70 exposure unit.
3. "EU 8000 exposure" is exposure using lamps with a monomodal distribution at 400 nm, 20 nm bandwidth, and 44 watts emitted power at 5 cm.
4. "Berkey Ascor wedge exposure"—exposure using the 2 KW unit with a #1406-02 photopolymer bulb at 45 cm.
5. "Bar coating"—coating using a #26 Meyer bar.
6. "Knife coating"—coating using knife to web gap specified at a web speed chosen to give good coating.
7. "Peel development"—"SCOTCH" Magic Mending tape laminated to the sample surface and then peeled off in the direction of the long dimension of the tape at an angle of 180° between the laminated position and the peeled position. A slow uniform rate of peel is applied.
8. "Aluminized polyester"—a 4 mil polyethylene terephthalate film to one side of which has been applied by vacuum coating a layer of aluminum metal approximately 750 Å thick. Further coatings indicated were applied to the aluminized side.
9. "Ar₃SSbF₆"—a commercially available mixture consisting of:

| 50% | $\phi S \phi S \phi_2 SbF_6^-$ |
| 45% | $\phi_3 S^+ SbF_6^-$ |
| 5% |  |

10. "Vitel PE 5987A"—a polyethyleneterephthalate polyester resin by Goodyear with $T_G = 27°$ C.
11. "Vitel PE 222"—a polyethyleneterephthalate polyester resin by Goodyear with $T_G = 47°$ C.
12. "THF"—Tetrahydrofuran.
13. "MEK"—methylethylketone.
14. "Triton X-100"—Nonionic surfactant by Rohm and Haas.
15. "Primed Polyester"—1 mil polyethyleneterephthalate primed with Vitel PE5987A.
16. "FC430"—3M Fluorad FC430 a fluorinated nonionic surfactant.
17. "Victawet 58B"—a phosphorated higher alcohol by Stauffer Chem. Co.

Examples 1–9 illustrate the necessity for surfactants in peel-apart constructions.

EXAMPLE 1

A composition of the formula

| 15% Vitel PE5987A in THF | 5.0 g |
| Ar₃SSbF₆ | 0.045 g |
| Sensitizer (5,10-diethoxy-16,17-dimethoxyviolanthrene) | 0.023 g | was bar coated onto aluminized polyester and air dried for 30 minutes.

Two separate samples were tested as follows.
(a) Wedge exposure 107 for 30 seconds
 Heated at 60° C. in an oven for 90 seconds
 On peel development a poor quality negative image of aluminum was left on the polyester.
(b) Wedge exposure 107 for 30 seconds
 Heated at 80° C. in an oven for 45 seconds.
 On peel development no image was produced.

EXAMPLE 2

A composition of the same formula as that in Example 1 with the addition of 0.015 g (2% relative to binder) of Fluorad FC430 was bar coated onto aluminized polyester and air dried for 30 minutes.

Two separate samples were tested as follows.
(a) Wedge exposure 107 for 15 seconds Heated in an oven at 60° C. for 90 seconds On peel development a good quality negative image in aluminum was left on the polyester and a complimentary positive image in aluminum was carried by the peeled layer.

(b) Wedge exposure 107 for 20 seconds

Heated in an oven at 80° C. for 45 seconds

On peel development a good quality negative image in aluminum was left on the polyester.

EXAMPLE 3

A composition of the following formula

| 15% Vitel PE222 in THF | 5.0 g |
|---|---|
| Sensitizer (of Example 1) | 0.015 g | was bar coated onto aluminized polyester and dried at 60° C. for two minutes.

A sample of this coating was given wedge exposure 70 for 30 seconds, heated in an oven for 90 seconds at 60° C., and peel developed. No image resulted.

EXAMPLE 4

A composition of the following formula

| 15% Vitel PE222 in MEK | 5.0 g |
|---|---|
| $\phi_2$ IPF$_6$ | 0.022 g |
| Sensitizer (of Example 1) | 0.015 g | was bar coated onto aluminized polyester and dried at 60° C. for two minutes.

A sample of this coating was given wedge exposure 70 for 30 seconds, heated in an oven at 60° C. for 30 seconds, and peel developed. No image resulted.

EXAMPLE 5

A composition as in Example 4 with the addition of

| $C_8F_{17}SO_3K$ | 0.002 g |
|---|---|
| Triton X-100 | 0.065 g | was bar coated onto aluminized polyester and dried at 60° C. for two minutes.

A sample of this coating was given wedge exposure 70 for 5 seconds, heated in an oven at 60° C. for 30 seconds, and peel developed. A good quality image in aluminum was revealed on the polyester support.

When taken with the results in Examples 3 and 4, the need for the photochemical acid generator and the surfactant materials in the composition was demonstrated.

EXAMPLE 6

A composition of the following formula

| 15% Vitel PE 5987A in THF | 5.0 g |
|---|---|

| | 0.046 g |
|---|---| was knife coated at a 2 mil thickness onto aluminized polyester and dried at 50° C. for 2 minutes. This was then laminated with primed polyester at 250° F. on a 25 inch industrial laminator from Transilwrap Company.

A sample of this material was given EU8000 exposure for 90 seconds and developed by passing through heated rollers at 130° C. at 10 feet per minute followed by peeling apart. No image resulted.

EXAMPLE 7

A composition as in Example 6 with the addition of

| $C_8F_{17}SO_3K$ | 0.002 g |
|---|---|
| FC430 | 0.012 g | was coated and laminated, and then exposed and developed as in Example 6.

A good quality negative image in aluminum was revealed on the polyester support.

EXAMPLE 8

A composition of the following formula

| 15% Vitel PE222 in MEK | 5.0 g |
|---|---|
| CBr$_4$ | 0.06 g |
| 9,10-Diethoxy anthracene (sensitizer) | 0.045 g | was bar coated onto aluminized polyester and air dried for 30 minutes.

A sample of the material was given Berkey Ascor wedge exposure for 60 seconds and heated in an oven at 80° C. for 60 seconds. On peel development no image was produced.

EXAMPLE 9

A composition as in Example 8 was prepared with the addition of

| $C_8F_{17}SO_3K$ | 0.002 g. |
|---|---|

This was bar coated and then treated, exposed, and developed as in Example 8.

A good quality negative image in aluminum was revealed on the polyester support.

EXAMPLES 10-28

A series of solutions were prepared to contain 3% Ar$_3$SSbF$_6$ and 3% 2-ethyl-9,10-dimethoxy anthracene (Sensitizer) based on binder by adding 0.022 g of Ar$_3$SSbF$_6$ and 0.022 g of Sensitizer #3 to 5 g of a 15% solution of Vitel PE222 resin in methyl ethyl ketone. Table VII lists the surfactant added to each solution, its weight percent based on binder and the log(CMC) of the surfactant. The solutions were bar coated onto aluminized polyester. The resulting films were given Berkey Ascor wedge exposure for 60 seconds and then heated in an oven for 90 seconds at 60° C. The construction was then peel developed. Table VII indicates whether a negative or positive aluminum image was obtained on the polyester base.

was used as the surfactant. A positive image of aluminum on the polyester base was obtained.

EXAMPLE 33

A composition of the following formula

TABLE VII

| Example | Surfactant | Weight %[a] | log (CMC)[b] | Image |
|---|---|---|---|---|
| 10 | $C_3F_{17}SO_3K$ | 0.3 | | Negative |
| 11 | $C_7F_{15}CO_2NH_4$ | 0.3 | −2.0 | Positive |
| 12 | $C_8F_{17}SO_3NH_4$ | 0.3 | | Negative |
| 13 | $C_8F_{17}SO_3H.pyridine$ | 0.3 | | Negative |
| 14 | Ammonium oleate | 3.0 | −3.4 | Positive |
| 15 | $C_{12}H_{25}$—$C_6H_4$—$SO_3Na$ | 3.0 | −2.9 | Negative |
| 16 | $(C_7F_{15}CO_2)_2Pb$ | 0.6 | −2.0 | Positive |
| 17 | $C_{12-16}CO_2C_2H_4SO_3Na$[c] | 3.0 | | Negative |
| 18 | $C_7F_{15}CO_2N(C_4H_9)_4$ | 3.0 | −2.0 | Negative |
| 19 | $C_{17}H_{35}CON(CH_3)CH_2CO_2NH_4$ | 0.3 | | Positive |
| 20 | $C_7F_{15}CON(CH_3)CH_2CO_2NH_4$ | 0.3 | | Positive |
| 21 | $C_7F_{15}CO_2H.pyridine$ | 0.3 | −2.0 | Positive |
| 22 | $C_7F_{15}CO_2C_4H_9NH_3$ | 0.3 | −2.0 | Positive |
| 23 | $C_7F_{15}CO_2(C_2H_5)_3NH$ | 0.3 | −2.0 | Positive |
| 24 | $C_7F_{15}CO_2H.piperidine$ | 0.3 | −2.0 | Positive |
| 25 | $C_7F_{15}CO_2H.aniline$ | 0.3 | −2.0 | Positive |
| 26 | $CH_3C_6H_4SO_3H.pyridine$ | 1.0 | | No image |
| 27 | Witconate P 10-59[d] | 3.0 | | Negative |
| 28 | Fosterge RD[e] | 3.0 | | Negative |

[a] % by weight of resin
[b] log (CMC) of the corresponding surfactant acid
[c] Coconut acid ester of sodium isethionate under the trade name Igepon AC-78 available from GAF Corporation
[d] Amine salt of dodecyl benzene sulfonic acid, Witco Chemical Corporation
[e] Diethanolamine salts of mono- and dialkyl (fatty) acid phosphates, Henkel Corporation

EXAMPLE 29

A composition of the following formula

| 15% Vitel PE5987A in THF | 5.0 g |
|---|---|
| $Ar_3SSbF_6$ | .045 g |
| Sensitizer (9,10-diethoxy anthracene) | .045 g |
| 4-methyl-2,6-di-t-butyl phenol | .045 g |
| $C_3F_7CO_2H.pyridine$ | .004 g | was bar coated and dried as in Example 1.

A sample of this material was given Berkey Ascor wedge exposure for two minutes and heated in an oven for one minute at 80° C.

Peel development gave a positive image of aluminum on the polyester base.

EXAMPLE 30

Example 29 was repeated except that $C_5F_{11}CO_2H$-.pyridine was used as the surfactant salt. A good positive image of aluminum was obtained on the polyester base.

EXAMPLE 31

A composition of the following formula

| 15% Vitel PE5987A in THF | 5.0 g |
|---|---|
| $\phi_2IPF_6$ | .045 g |
| Sensitizer (5,10-diethoxy-12, 16,17-trichlorovolanthrene) | .007 g |
| $(C_8F_{17}N(Et)C_2H_4O)_2PO_2NH_4$ | .002 g | was coated, dried, exposed and developed as in Example 3 to give a positive image of aluminum on the polyester base.

EXAMPLE 32

Example 30 was repeated except Victawet 58B (a phosphated higher alcohol from Stauffer Chemical Co.)

| 15% Vitel PE222 in MEK | 5.0 g |
|---|---|
| Sensitizer (2-ethyl-9,10-dimethoxyanthracene) | 0.022 g |
| $\phi_2IPF_6$ | 0.022 g |
| $C_8F_{17}SO_3K$ | 0.002 g |
| ethyl carbitol | 0.09 g | was knife coated and dried as in Example 6. A sample of this material was give Berkey Ascor wedge exposure for 10 seconds followed by heating in an oven at 80° C. for 30 seconds. Peel development gave a negative image of aluminum on the polyester base.

EXAMPLE 34

A composition of the following formula

| 15% VMCH (Copolymer of vinyl chloride and vinyl acetate, modified by interpolymerization with a dibasic acid, from Union Carbide Corp.) in MEK | 5.0 g |
|---|---|
| $\phi_2IPF_6$ | .022 g |
| Sensitizer (of Example 33) | .022 g |
| $C_7F_{15}CO_2NH_4$ | .0008 g | was bar coated and dried as in Example 1. A sample of this material was given Berkey Ascor wedge exposure for 60 seconds and heated at 60° C. for 90 seconds. Peel development left a negative image of aluminum on the polyester base.

EXAMPLE 35

A composition of the following formula

| 15% Vitel PE222 in MEK | 5.0 g |
|---|---|
| $\phi_2IPF_6$ | .022 g |
| Sensitizer (5,10-diethoxy-16, 17-dimethoxyviolanthrene) | 0.14 g |

-continued cated time, then heated in an oven for 60 seconds at 80° C., and peel developed.

TABLE VIII

| Ex. No. | Surfactant | Exposure time (min.) | Image | Surfactant type | Source |
|---|---|---|---|---|---|
| 36 | $C_8F_{17}SO_2N(CH_3)C_2H_4OH$ | 1 | Negative | Fluorinated hydrophobe | |
| 37 | $C_8F_{17}SO_2N(CH_3)C_4H_8OH$ | 1 | Negative | Fluorinated hydrophobe | |
| 38 | $C_8F_{17}SO_2N(CH_3)C_{11}H_{22}OH$ | 1 | Negative | Fluorinated hydrophobe | |
| 39 | Fluorad FC-170C | 1 | Negative | Fluorinated hydrophobe | 3M |
| 40 | Fluorad FC-134 | 1 | No Image | Fluorinated cationic | 3M |
| 41 | Triton X-100 | 3 | Negative | Polyoxyethylene (POE) alkylphenol | Rohm and Haas |
| 42 | Igepal CO-430 | 1 | No Image | POE alkylphenol | GAF Corp. |
| 43 | Igepal CO-530 | 5 | No Image | POE alkylphenol | GAF Corp. |
| 44 | Igepal CA-630 | 1 | Negative | POE alkylphenol | GAF Corp. |
| 45 | Igepal CO-210 | 5 | No Image | POE alkylphenol | GAF Corp. |
| 46 | Triton N-57 | 5 | No Image | POE alkylphenol | Rohm and Haas |
| 47 | Tergitol 15-S-9 | 1 | Negative | Polyethylene glycol ether, 2° alcohol | Union Carbide |
| 48 | Brij 35 | 1 | Negative | PEO lauryl ether | ICI Americas, Inc. |
| 49 | Brij 58 | 1 | Negative | PEO cetyl ether | ICI Americas, Inc. |
| 50 | Brij 78 | 1 | Negative | POE stearyl ether | ICI Americas, Inc. |
| 51 | Siponic SK | 1 | Negative | POE mercaptan | Alcolac Inc. |
| 52 | Siponic 218 | 1 | No Image | POE mercaptan | Alcolac Inc. |
| 53 | Myrj 53 | 1 | Negative | POE stearate | ICI Americas, Inc. |
| 54 | Pluracol TP-740 | 1 | Negative | Polyol | BASF Wyandotte |
| 55 | Pluracol TP-1540 | 1 | Negative | Polyol | BASF Wyandotte |
| 56 | Surfynol 61 | 5 | No Image | Acetylenic glycol | Air Prdcs. & Chem. Inc. |
| 57 | Surfynol 104 | 5 | No Image | Acetylenic glycol | Air Prdcs. & Chem. Inc. |
| 58 | Surfynol 440 | 1 | Negative | Polyoxyethylated acetylenic glycol | Air Prdcs. & Chem. Inc. |
| 59 | Pluronic F-127 | 5 | No Image | Condensate of ethylene oxide | BASF Wyandotte |
| 60 | Pluronic F-68 | 5 | No Image | with condensate of | BASF Wyandotte |
| 61 | Pluronic P-65 | 5 | No Image | propylene oxide and | BASF Wyandotte |
| 62 | Pluronic P-104 | 1 | Negative | propylene glycol | BASF Wyandotte |
| 63 | 9-Octadecenamide | 1 | Negative | Fatty acid amide | |
| 64 | Katapol PN-430 | 3 | Negative | Polyoxyethylated tallow amine | GAF Corp. |
| 65 | Witcamide 5138 | 1 | Negative | Alkanol amide | Witco Chem. Corp. |
| 66 | Witcamide 511 | 5 | No Image | Modified alkanol amide | Witco Chem. Corp. |
| 67 | Span 20 | 1 | No Image | Sorbitan monolaurate | ICI Americas, Inc. |
| 68 | Span 85 | 5 | No Image | Sorbitan trioleate | ICI Americas, Inc. |
| 69 | Emsorb 2515 | 4 | No Image | Sorbitan monolaurate | Emery Ind. |
| 70 | Emsorb 2500 | 1 | Negative | Sorbitan monoleate | Emery Ind. |
| 71 | Emsorb 2505 | 1 | Negative | Sorbitan monostearate | Emery Ind. |
| 72 | Tween 20 | 1 | Negative | POE sorbitan monolaurate | ICI Americas, Inc. |
| 73 | Tween 65 | 1 | Negative | PO sorbitan tristearate | ICI Americas, Inc. |
| 74 | Emsorb 6900 | 1 | Negative | POE sorbitan monoleate | Emery Ind. |
| 75 | Trylox 6747 | 1 | Negative | POE sorbitol hexaoleate | Emery Ind. |
| 76 | Emulphor EL-719 | 1 | Negative | POE vegetable oil | GAF Corp. |
| 77 | Triton B-1956 | 1 | Negative | Modified phthalic glycerol alkyl resin | Rohm and Haas |
| 78 | Sulfobetaine DC | 1 | Negative | Amphoteric | Henkel Corp. |
| 79 | Bis-hydroxyethyl azelate | 1 | Negative | Amphoteric | |
| 80 | Monoplex DOA | 5 | No Image | | Rohm and Haas |
| 81 | Hipochem CAD | 1 | Positive | Amphoteric | High Point Chemical |
| 82 | Miranol C2M | 5 | No Image | Amphoteric | Miranol Chem. Co. |
| 83 | Monateric CA-35 | 5 | Positive | Amphoteric | Mona Industries |
| 84 | Tetronic 1307 | 5 | No Image | Addition of ethylene oxide | BASF Wyandotte |
| 85 | Tetronic 707 | 5 | No Image | to condensate of propylene | BASF Wyandotte |
| 86 | Tetronic 904 | 5 | No Image | oxide and ethylene diamine | BASF Wyandotte |

$C_7F_{15}CO_2H$ pyridine salt .004 g was bar coated and dried as in Example 1, exposed in a 3M Model 70 unit for five seconds, tape laminated and peeled to give a positive image of aluminum on the polyester base.

EXAMPLES 36–86

A series of solutions were prepared to contain 6% by weight $Ar_3SSbF_6$ and 6% by weight of the Sensitizer of Example 8 based on binder by adding 0.045 g $Ar_3SSbF_6$ and 0.045 g of the Sensitizer to 5.0 g of a 15% solution of Vitel PE222 resin in methyl ethyl ketone. Table VIII lists the surfactant added to each solution, 0.022 g (3% based on weight of binder), and the image obtained. The solutions were bar coated onto aluminized polyester as in Example 1. Samples of the coatings were given Berkey Ascor wedge exposure for the indi-

EXAMPLES 87–99

A series of solutions were prepared to contain 6% (0.045 g) by weight $Ar_3SSbF_6$, 6% (0.045 g) by weight of the Sensitizer of Example 8 and 6% (0.045 g) by weight 2,6-di-t-butyl-4-methyl phenol based on binder in 5.0 g of a 15% solution of Vitel PE 5987A resin in tetrahydrofuran. Table IX lists the type of surfactant added to each solution at 0.004 g (0.6% based on weight of binder) and the type of image obtained in aluminum on the polyester base. The solutions were coated onto aluminized polyester. The films were given 90 seconds Berkey Ascor wedge exposure, heated 90 seconds in an oven at 60° C., and peel developed.

TABLE IX

| Example | Surfactant | Image | Surfactant type | Source |
|---|---|---|---|---|
| 87 | $C_{18}H_{37}NH_2$ | Positive | Fatty amine | |
| 88 | $C_{18}H_{37}NHCH_3$ | Positive | Fatty amine | |
| 89 | $C_{16}H_{33}NH_2$ | Positive | Fatty amine | |
| 90 | $C_{12}H_{25}NH_2$ | Positive | Fatty amine | |
| 91 | $(C_6H_5)_3N$ | No Image | | |
| 92 | Kemamine P-990D | Positive | Primary amine | Witco Chem. Corp. |
| 93 | Kemamine P-989D | Positive | Primary amine | Witco Chem. Corp. |
| 94 | Kemamine P-190D | Positive | Primary amine | Witco Chem. Corp. |
| 95 | Kemamine T-1902D | No Image | Tertiary amine | Witco Chem. Corp. |
| 96 | Duomeen O | Positive | N—oleyl trimethylene amine | Armak Ind. |
| 97 | Duomeen C | Positive | N—coco trimethylene amine | Armak Ind. |
| 98 | Ethoxy ethoxy ethoxy propylamine | No Image | | |

EXAMPLES 99–105

A series of solutions were prepared to contain 3% (0.022 g) by weight $\phi_2IPF_6$ and 1% (0.007 g) by weight of the Sensitizer of Example 31 based on binder in 5.0 g of a 15% solution of Vitel PE 5987A resin in THF. Table X lists the surfactant added to the solution, the weight of surfactant used, the type of image obtained in aluminized polyester, the class of surfactant and the source. The solutions were bar coated and dried for two minutes at 60° C. The samples were given wedge exposure 70 for 15 seconds, heated for 30 seconds at 80° C. and peel developed.

EXAMPLE 106

A composition of the following formula

| 10% Vitel PE 5987A in THF | 5.0 g |
|---|---|
|  | .045 g | was knife coated at a 2 mil thickness onto aluminized polyester and dried at 50° C. for 2 minutes. A sample of this coating was given EU 8000 wedge exposure for 60 seconds and heated by passing through 130° C. rollers at 10 feet per minute. On peel development a poor, faint negative image in aluminum was left on the polyester.

EXAMPLE 107

A composition of the same formula as that in Example 106 with the addition of 0.0022 g (0.44% relative to the binder) of $C_8F_{17}SO_3K$ was knife coated and dried as in Example 10. A sample of this coating was given EU 8000 wedge exposure for 30 seconds, heated and peel developed as in Example 106 to give a good negative image in aluminum on the polyester.

TABLE X

| Example | Surfactant | Weight % | Image | Surfactant type | Source |
|---|---|---|---|---|---|
| 99 | Monateric CA-35 | 0.3% | Positive | Amphoteric | Mona Ind. Inc. |
| 100 | Monateric ADA | 0.8% | Positive | Amphoteric | Mona Ind. Inc. |
| 101 | Monateric LF-100 | 0.6% | No Image | Amphoteric | Mona Ind. Inc. |
| 102 | Monateric 1000 | 0.6% | No Image | Amphoteric | Mona Ind. Inc. |
| 103 | Hipochem CAD | 0.6% | Positive | Amphoteric | High Point Chem. Corp. |
| 104 | Schercoteric MS | 0.6% | Positive | Amphoteric | Scher Chem. Inc. |
| 105 | Schercoteric MS-5F | 1.2% | Positive | Amphoteric | Scher Chem. Inc. |

EXAMPLE 108

A coating solution was prepared to contain 3% (0.022 g) by weight $\phi_2IPF_6$, 1% (0.007 g) by weight of the Sensitizer of Example 31 and 1% (0.007 g) by weight Carbowax 4000 (a polyethylene glycol made by Union Carbide Corp.) based on binder in 5.0 g of a 15% solution of Vitel PE 5987A resin in tetrahydrofuran. The solution was bar coated onto aluminized polyester. Samples of this coating were given 10 seconds wedge exposure 70 and heated in an oven at 60° C. for 90 seconds. Peel development revealed a negative image in aluminum on polyester.

EXAMPLE 109

Example 106 was repeated except that 2% (0.014 g) by weight Fluorad FC-430 (a nonionic fluorinated hydrophobe made by 3M) was used as the surfactant. In addition, the film was laminated prior to exposure with 0.001 inch polyethylene terephthalate primed with Vitel PE 5987A resin by passing through rollers heated to 250° F. The film was given wedge exposure 70 for 3 seconds while simultaneously heating the film for a total of 5 seconds at 70° C. Peeling apart the laminated films left a negative image in aluminum on the polyester base.

EXAMPLE 110

A composition of the following formula

| 15% Vitel PE 222 in MEK | 5.0 g |
|---|---|
| [structure: Cl₃C-substituted bis-triazine linked by CH=CH to phenyl-OCH₃] | 0.045 g |
| Igepon AC-78 | 0.015 g | was bar coated onto aluminized polyester and air dried for 30 minutes. A sample of this coating was given Berkey Ascor wedge exposure for 90 seconds and heated at 60° C. in an oven for 90 seconds. One peel development a good negative image in aluminum was left on the polyester.

EXAMPLES 111-113

A series of solutions was prepared to contain 6% by weight $Ar_3SSbF_6$ and 6% by weight of the Sensitizer of Example 8 based on binder by adding 0.045 g $Ar_3SSbF_6$ and 0.045 g of the Sensitizer to 5.0 g of a 15% solution of Vitel PE 5987A in tetrahydrofuran. Table XI lists the weight of the surfactant added to each solution and the imaged obtained. The solutions were bar coated onto aluminized polyester as in Example 1. Samples of the coatings were given Berkey Ascor wedge exposure for one minute, then passed through heated rollers (260° F.) at two feet per minute and peel developed.

TABLE XI

| Ex. No. | Surfactant | Weight | Image |
|---|---|---|---|
| 111 | $C_8F_{17}So_2Na$ | .009 g | Positive |
| 112 | Aerosol A-103 | .007 g | Positive |
| 113 | Aerosol 501 | .007 g | Positive |

EXAMPLES 114-135

A series of solutions was prepared and coated as in Examples 111-113 except that Vitel PE 222 was used in place of Vitel PE 5987A. Table XII lists the weight of surfactant used and the image obtained. Samples of the coatings were given Berkey Ascor wedge exposure for thirty seconds, then heated in an 80° C. oven for one minute and peel developed.

TABLE XII

| Ex. No. | Surfactant | Weight | Image |
|---|---|---|---|
| 114 | Actrasol SR-75 | .008 g | Positive |
| 115 | Actrasol PSR | .007 g | Negative |
| 116 | $C_{17}H_{35}CH(OH)SO_3Na$ | .004 g | Negative |
| 117 | Hipochem Dispersol SB | .004 g | Negative |
| 118 | Sipon EA | .015 g | Negative |
| 119 | Sipon L-22 | .008 g | Negative |
| 120 | Triton 770 | .010 g | Negative |
| 121 | $(C_8F_{17}SO_3)_2Mg$ | .002 g | Negative |
| 122 | $C_{10}F_{21}SO_3K$ | .002 g | Negative |
| 123 | $C_8H_{17}O_2CCH_2CH(SO_3Na)CO_2C_8H_{17}$ | .002 g | Negative |
| 124 | Piperidinium octanoate | .009 g | Positive |
| 125 | Morpholinium octanoate | .009 g | Positive |
| 126 | 2,2'-Bipyridinium Mono (perfluorooctanoate) | .004 g | Positive |
| 127 | Mark TDP | .022 g | Negative |
| 128 | Phenyldidecyl phosphite | .022 g | Negative |
| 129 | Tergitol NPX | .022 g | Negative |
| 130 | Igepal CM-710 | .022 g | Negative |
| 131 | Carbowax 350 | .03 g | Negative |
| 132 | Methoxy triglycol | .03 g | Negative |
| 133 | Aromox DMCD | .009 g | Positive |
| 134 | Aromox 18/12 | .022 g | Positive |
| 135 | $C_{10}H_{21}NH_2$ | .006 g | Positive |

EXAMPLES 136-139

A series of solutions was prepared to contain 9% by weight $Ar_3SSbF_6$ and 9% by weight of the Sensitizer of Example 8 based on binder by adding 0.045 g $Ar_3SSbF_6$ and 0.045 g of the Sensitizer to 5.0 g of a 10% solution of Vinac B-100 (a vinyl acetate polymer from Air Products) in 50/50 methylethyl ketone and toluene. Table XII lists the weight of surfactant added to each solution and the image obtained. The solutions were bar coated onto aluminized polyester as in Example 1. Samples of the coatings were given Berkey Ascor wedge exposure for one minute, heated in an 80° C. oven for one minute and peel developed.

TABLE XIII

| Ex. No. | Surfactant | Weight | Image |
|---|---|---|---|
| 136 | FC-430 | .006 g | Positive |
| 137 | $C_8F_{17}SO_3K$ | .003 g | Negative |
| 138 | Pyridinium perfluorooctanoate | .005 g | Positive |
| 139 | $C_{18}H_{37}NH_2$ | .005 g | Positive |

EXAMPLE 140

A composition of the following formula

| | |
|---|---|
| 15% Vitel PE5987A in THF | 5.0 g |
| $Ar_3SSbF_6$ | .045 g |
| Sensitizer (of Example 1) | .014 g |
| $C_7F_{15}CO_2NH_4$ | .002 g |
| 4-Methyl-2,6-di-t-butyl phenol | .045 g | was bar coated onto vapor coated tin (approximately 70 nm) on polyester and air dried for 30 minutes. A sample of this coating was given wedge exposure 70 for twenty seconds, then 60° C. oven heated and peel developed to give a good quality positive image in tin left on the polyester.

EXAMPLE 141

The composition of Example 10 was coated as in Example 1 onto vapor coated bismuth (approximately 80 nm) on polyester. A portion of this sample was given Berkey Ascor wedge exposure for one minute, heated in an 80° C. oven for one minute and peel developed to give a good quality negative image in bismuth left on the polyester.

EXAMPLE 142

A composition of the following formula:

| | |
|---|---|
| 15% Vitel PE222/85:15 MEK-toluene | 20 g |
| $\phi_2IPF_6$ | .09 g |
| Sensitizer (of Example 8) | .09 g |
| $C_8F_{17}SO_3K$ | .006 g |
| FC-430 | .024 g | was coated as in Example 1 onto vapor coated silver (approximately 60 nm) on polyester. A portion of this coating was given Berkey Ascor wedge exposure for ten seconds, then heated in an 80° C. oven for thirty seconds and peel developed to give a good quality negative image in silver left on the polyester.

EXAMPLE 143

The composition of Example 142 was coated as in Example 1 onto vapor coated tin (approximately 60 nm) on Kapton (polyimide film from Dupont). A portion of this sample was given Berkey Ascor wedge exposure for two seconds, then heated in an 80° C. oven for one minute and peel developed to give a good quality negative image in tin left on Kapton.

EXAMPLES 144-147

A series of solutions was prepared to contain 3% by weight of the Sensitizer of Example 10 based on binder by adding 0.022 g of the Sensitizer to 5.0 g of a 15% solution of Vitel PE222 in MEK. Table XIV lists the weight of mixed photochemical acid generator-surfact- ant acid salt (referred to as the mixed salt) added to each solution and the image obtained. The solutions were bar coated onto aluminized polyester as in Example 1. Samples of the coatings were given Berkey Ascor wedge exposure for one minute, then heated for 90 seconds in a 60° C. oven and peel developed.

TABLE XIV

| Ex. No. | Mixed Salt | Weight | Image |
|---|---|---|---|
| 144 | $\phi_2IC_8F_{17}SO_3$ | .022 g | Negative |
| 145 | $Ar_3SC_7F_{15}CO_2$ | .044 g | Negative |
| 146 | $Ar_3SC_{12-16}C_2H_4SO_3$ | .022 g | Negative |
| 147 | $\phi IC_{12-16}C_2H_4SO_3$ | .044 g | Negative |

EXAMPLE 148

Example 107 was repeated except that the diazonium salt of Example 107 was replaced by the same weight of the following diazonium salt to give a good negative image in aluminum on the polyester.

EXAMPLE 149

Example 107 was repeated except that the diazonium salt of Example 107 was replaced by the same weight of the following diazonium salt to give a good negative image in aluminum on the polyester.

We claim:

1. A photosensitive, imageable article comprising:
   (a) a substrate,
   (b) a frangible, thin, light-opaque layer strippably adhered to said substrate, and
   (c) a photosensitive layer comprising in admixture a film forming polymeric binder, between 0.2 and 10% by weight of the dry photosensitive layer of at least one acid-sensitive surfactant, and between 0.5 and 10% by weight of the dry photosensitive layer of at least one photochemical acid generator which alters the surface activity of the acid-sensitive surfactant when the photochemical acid generator is photoactivated, and said photosensitive layer is strippably adhered to said light-opaque layer wherein the peel strength of the unexposed photosensitive layer to said light-opaque layer is less than or greater than the peel strength of said light-opaque layer to said substrate, and the peel strength of the photoactivated photosensitive layer to said light-opaque layer respectively becomes greater than or less than the peel strength of said light-opaque layer to said substrate.

2. The article of claim 1 wherein the degree of difference in peel strengths between (A) the light-opaque layer and the photosensitive layer and (B) the light-opaque layer and the substrate is at least 10 percent both in the unexposed article and the photoactivated article.

3. The article of claim 1 wherein said light-opaque layer comprises a metal, metal oxide, metal salts, or mixtures of metal and either metal oxide or metal salt.

4. The article of claim 2 wherein said light-opaque layer comprises a metal, metal oxide, metal salts, or mixtures of metal and either metal oxide or metal salt.

5. The article of claim 3 wherein said light-opaque layer has a thickness of 5 to 500 nm and a peel strength from said substrate of 0.8 to 40 g/cm.

6. The article of claim 4 wherein said light-opaque layer has a thickness of 5 to 500 nm and a peel strength from said substrate of 0.8 to 40 g/cm.

7. The article of claim 1 wherein said light-opaque layer comprises a metal having a thickness of 5 to 500 nm and a peel strength from said substrate of 0.8 to 40 g/cm.

8. The article of claim 2 wherein said light-opaque layer comprises a metal having a thickness of 5 to 500 nm and a peel strength from said substrate of 0.8 to 40 g/cm.

9. The article of claim 1 wherein said acid-sensitive surfactant comprises at least one surfactant selected from the class consisting of:
   (a) non-ionic surfactants,
   (b) surfactant acid salts,
   (c) neutral forms of cationic surfactants, and
   (d) amphoteric surfactants.

10. The article of claim 2 wherein said acid-sensitive surfactant comprises a surfactant selected from the class consisting of:
    (a) non-ionic surfactants,
    (b) surfactant acid salts,
    (c) neutral forms of cationic surfactants, and
    (d) amphoteric surfactants.

11. The article of claim 4 wherein said acid-sensitive surfactant comprises a surfactant selected from the class consisting of:
    (a) non-ionic surfactants,
    (b) surfactant acid salts,
    (c) neutral forms of cationic surfactants, and
    (d) amphoteric surfactants.

12. The article of claim 5 wherein said acid-sensitive surfactant comprises a surfactant selected from the class consisting of:
    (a) non-ionic surfactants,
    (b) surfactant acid salts,
    (c) neutral forms of cationic surfactants, and
    (d) amphoteric surfactants.

13. The article of claim 6 wherein said acid-sensitive surfactant comprises a surfactant selected from the class consisting of:
    (a) non-ionic surfactants,
    (b) surfactant acid salts,
    (c) neutral forms of cationic surfactants, and
    (d) amphoteric surfactants.

14. The article of claim 7 wherein said acid-sensitive surfactant comprises a surfactant selected from the class consisting of:
    (a) non-ionic surfactants,
    (b) surfactant acid salts,
    (c) neutral forms of cationic surfactants, and
    (d) amphoteric surfactants.

15. The article of claim 1 wherein said photochemical acid generator comprises a photochemical acid generator selected from the group consisting of diazonium salts, aromatic sulfonium salts, aromatic iodonium salts, diazo oxides, organic compounds with photolabile halogen and polynuclear chromophore-substituted halomethyl-s-triazines.

16. The article of claim 4 wherein said photochemical acid generator comprises a photochemical acid generator selected from the group consisting of diazonium salts, aromatic sulfonium salts, aromatic iodonium salts, diazo oxides, organic compounds with photolabile halogen and polynuclear chromophore-substituted halomethyl-s-triazines.

17. The article of claim 5 wherein said photochemical acid generator comprises a photochemical acid generator selected from the group consisting of diazonium salts, aromatic sulfonium salts, aromatic iodonium salts, diazo oxides, organic compounds with photolabile halogen and polynuclear chromophore-substituted halomethyl-s-triazines.

18. The article of claim 8 wherein said photochemical acid generator comprises a photochemical acid generator selected from the group consisting of diazonium salts, aromatic sulfonium salts, aromatic iodonium salts, diazo oxides, organic compounds with photolabile halogen and polynuclear chromophore-substituted halomethyl-s-triazines.

19. The article of claim 11 wherein said photochemical acid generator comprises a photochemical acid generator selected from the group consisting of diazonium salts, aromatic sulfonium salts, aromatic iodonium salts, diazo oxides, organic compounds with photolabile halogen and polynuclear chromophore-substituted halomethyl-s-triazines.

20. A photosensitive, imageable article comprising:
(a) a substrate,
(b) a frangible, thin, light-opaque layer comprising a metal, metal oxide, metal salt or mixture of metal and other metal oxide or metal salt strippably adhered to said substrate, and
(c) a photosensitive layer comprising in admixture a film forming polymeric binder, between 0.1 and 5% by weight of said binder of at least one acid-sensitive surfactant, and between 0.5 and 10% by weight of dry photosensitive layer of at least one photochemical acid generator which alters the surface activity of the acid-sensitive surfactant when the photochemical acid generator is photoactivated, and said photosensitive layer is strippably adhered to said light-opaque layer, wherein the peel strength of the unexposed photosensitive layer to said light-opaque layer is less than or greater than the peel strength of said light-opaque layer to said substrate, and the peel strength of the photoactivated photosensitive layer to said light-opaque layer respectively becomes greater than or less than the peel strength of said light-opaque layer to said substrate, and wherein the degree of difference in peel strengths between (a) the light-opaque layer and the photosensitive layer and (b) the light-opaque layer and the substrate is at least 10 percent both in the unexposed article and the photoactivated article.

* * * * *

UNITED STATES PATENT AND TRADEMARK OFFICE
CERTIFICATE OF CORRECTION

PATENT NO. : 4,511,641
DATED : April 16, 1985
INVENTOR(S) : Stanley C. Busman and John C. Chang It is certified that error appears in the above-identified patent and that said Letters Patent is hereby corrected as shown below:

Column 10, line 44, "alkyphenol" should read --alkyphenyl--.
Column 16, line 45, "X-X-R" should read --H-X-R--.

Signed and Sealed this

Eighth Day of April 1986

[SEAL]

Attest:

DONALD J. QUIGG

*Attesting Officer*  *Commissioner of Patents and Trademarks*